United States Patent [19]

Bayer et al.

[11] Patent Number: 5,158,990
[45] Date of Patent: Oct. 27, 1992

[54] COATING COMPOUNDS FOR ELECTRICAL AND ELECTRONIC COMPONENTS CONTAINING VITREONS FUSED SILICA

[75] Inventors: Heiner Bayer, Olching; Barbara Lehner, Munich; Hans-Peter Fritsch, Munich; Kurt Wohak, Munich, all of Fed. Rep. of Germany

[73] Assignee: Siemens Aktiengesellschaft, Munich, Fed. Rep. of Germany

[21] Appl. No.: 827,898

[22] Filed: Jan. 30, 1992

Related U.S. Application Data

[63] Continuation of Ser. No. 476,713, Feb. 8, 1990, abandoned.

[30] Foreign Application Priority Data

Mar. 8, 1989 [DE] Fed. Rep. of Germany ....... 3907535

[51] Int. Cl.$^5$ ................................................. C08K 3/36
[52] U.S. Cl. ......................................... 522/83; 522/31; 522/77; 427/508
[58] Field of Search ................. 522/83, 31, 77; 427/54.1

[56] References Cited

U.S. PATENT DOCUMENTS

| | | | |
|---|---|---|---|
| 4,054,498 | 10/1977 | Tarwid | 204/159.11 |
| 4,373,040 | 2/1983 | Allen | 523/466 |
| 4,390,615 | 6/1983 | Courtney et al. | 430/315 |
| 4,677,137 | 6/1987 | Bany et al. | 522/31 |
| 4,780,752 | 10/1988 | Angerstein et al. | 357/72 |
| 4,842,800 | 6/1989 | Walles et al. | 264/272.13 |
| 4,880,662 | 11/1989 | Habrich et al. | 427/54.1 |

FOREIGN PATENT DOCUMENTS 0114258 11/1983 European Pat. Off. .
0182744 11/1985 European Pat. Off. .

OTHER PUBLICATIONS

Goosey, Plastics for Electronics, Elsevier Applied Science Publishers, Ltd. 1985, pp. 43 and 99–120.

Primary Examiner—Marion E. McCamish
Assistant Examiner—Mark A. Chapman
Attorney, Agent, or Firm—Hill, Van Santen, Steadman & Simpson

[57] ABSTRACT

A drop coating compound in particular, for unhoused electrical and electronic circuits and components. The compound includes highly filled ultraviolet-curable epoxy resin compounds having improved properties with respect to their use and in comparison to previously used, predominantly two-component, thermally curable resins.

10 Claims, 1 Drawing Sheet

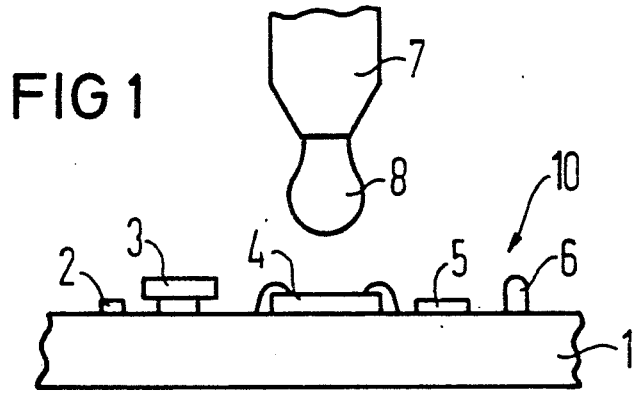
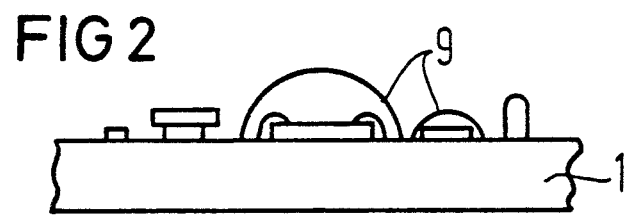
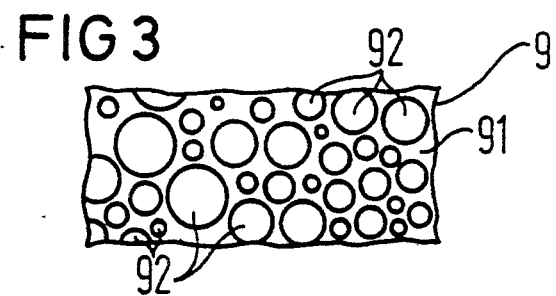
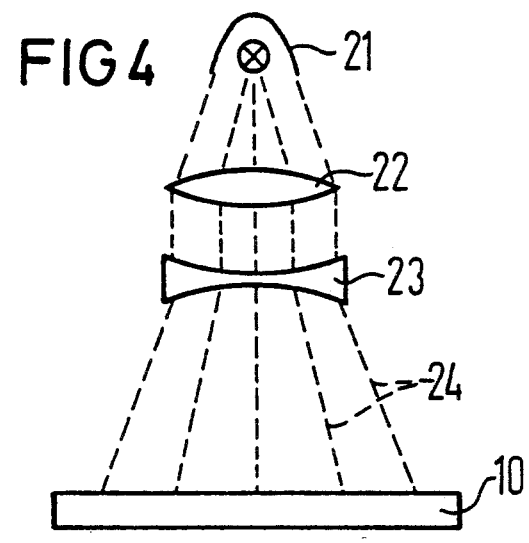

COATING COMPOUNDS FOR ELECTRICAL AND ELECTRONIC COMPONENTS CONTAINING VITREONS FUSED SILICA

This is a continuation of application Ser. No. 476,713, filed Feb. 8, 1990, now abandoned.

BACKGROUND OF THE INVENTION

The present invention relates to compounds, having a low coefficient of thermal expansion, for coating electrical and electronic components (drop coating compounds).

Various electronic components, particularly integrated circuits, are typically constructed on a substrate, for example, a semiconductor material, in a process that includes many steps. After the electronic component is created, it is glued, soldered, alloyed and, then, provided with electrical terminals that include fine wires. To provide protection for the circuit and exposed wires, it is known to enclose the components in a housing. To further protect the components, or instead of a housing, the components can be cast out or coated with an electrically insulating plastic compound.

The components, however, can also be used as "bare", or unhoused ICs. But, when so used, the component must be protected against environmental influences, for example, moisture, dust, and mechanical damage, after they are integrated in a hybrid circuit, a device, or a transport means. One technique for protecting such components is through use of a drop coating. In the process or drop coating, thermoset resins are dripped onto the regions, or circuits, to be protected, and the resin is then cured.

Thermoset resins that are used as a drop coating must satisfy a number of requirements. In particular, the resin, or any compound for that matter, that is to be in direct contact with the component to be coated cannot adversely affect the component or cause the component to deteriorate. Furthermore, during the curing process, as well as during later operation, the compound, used for drop coating, cannot, among other things, exhibit an excessively large volume change due to temperature gradients. If the coefficient of thermal expansion and glass temperature, lying in the region of the operating temperatures, of the compound is too large this can result in, among other things, a tearing of the wires and cause the component to malfunction.

It has been found that epoxy resins satisfy the aforementioned requirements when used in combination with an inorganic filler. For example, it is known to use a drop coating compound that is filled with a two-component epoxy resin. However, a great disadvantage of such resins is the necessity to mix the resin with a hardening component before it is used. This is due to the fact that pre-mixed resins can only be worked for a limited time period because the curing process, that proceeds at ambient temperature, causes the viscosity of the compound to increase.

An attempt to overcome this problem is to use pre-mixed products that are sold in a frozen state, what are referred to as "frozen products". This thereby shifts the mixing from the user to the manufacturer. But, these thermoset resins, that must be thawed before their use, also exhibit several disadvantages. Such resins only have a limited time within which they can be processed and accordingly they provide only a short molding time for application to the devices. Furthermore, a thorough cleaning of reactive resin residues from all parts that come into contact with the resin is necessary in intervals that are just as short in order to preserve the functionability. Therefore, a continuous production process is thus made more difficult. Moreover, the pre-mixed frozen products exhibit other technical and economical disadvantages.

SUMMARY OF THE INVENTION

The present invention provides a drop coating compound that has the necessary and required chemical/physical properties but avoids the disadvantages of known drop coating compounds.

To this end, the present invention provides a drop coating compound having a low coefficient of expansion for coating unhoused electrical and electronic components. The drop coating compound includes a cationically curable epoxy resin mixture having a glass temperature above 140° C. defined in the cured condition. A fine-particle filler, compatible with a cationic curing process and transparent to ultraviolet light, is provided in the compound that has a maximum grain size of 150 $\mu$m. The grain size distribution of the filler is selected such that it is suitable for achieving an optimally tight spatial packing of the filler in the resin. The filler portion of the compound comprises between approximately 30 to about 80 percent by volume of the compound. The compound further includes a photo-initiator for the cationic curing process. Additionally, if desired, known additives that are standard for epoxy resin compounds can be included in the compound.

In an embodiment of the drop coating compound of the present invention, the filler is an inorganic filler and contains at least one constituent that is selected from the group consisting of aluminum oxide, aluminum hydroxide, calcium carbonate, magnesium oxide, silica, vitreous fused silica, and glass.

In an embodiment of the drop coating compound of the present invention, the filler has the following grain size distribution: approximately 55 to about 95 weight percent of the particles have a diameter of approximately 1 to about 150 $\mu$m; approximately 1 to about 35 weight percent of the particles have a diameter of between approximately 1 to about 25 $\mu$m; and approximately 1 to about 20 weight percent of the particles have a diameter below approximately 5 $\mu$m.

In an embodiment of the drop coating compound of the present invention, the filler contains organic polymers that are selected from the group of compounds consisting of polyethersulfone, polyphenylensulfide, polyether ether ketone, silicon resins, and liquid-crystalline polymers.

In an embodiment of the drop coating compound of the present invention, the filler is a plastic having an adequately low coefficient of thermal expansion.

In an embodiment of the present invention, the surface of the filler particles is chemically pre-treated with an agent so as to have organic residues with reactive groups that are suitable for reaction with the epoxy resin.

In an embodiment of the present invention, the epoxy resin mixture additionally contains a elastifying constituent that is adapted to exhibit desired properties.

In an embodiment of the present invention, the drop coating compound includes additional constituents.

In an embodiment of the drop coating compound, the compound includes multiple alcohols or vinyl ethers of multiple alcohols therein.

In an embodiment of the drop coating compound, epoxy soy bean oil is contained therein.

In an embodiment of the present invention, the drop coating compound is used to coat unhoused ICs, hydride circuits, memory modules, or discrete components.

Additional features and advantages of the present invention are described in, and will be apparent from, the detailed description of the presently preferred embodiments and from the drawings.

BRIEF DESCRIPTION OF THE DRAWINGS

FIG. 1 illustrates a cross-sectional view of a device wherein a coating drop of the present invention is being applied onto a substrate that contains a circuit.

FIG. 2 illustrates the circuit of FIG. 1 after the application of two of the drop coatings of the present invention.

FIG. 3 illustrates a portion of a drop coating compound of the present invention.

FIG. 4 illustrates a device for curing applied coating drops.

DETAILED DESCRIPTION OF THE PRESENTLY PREFERRED EMBODIMENTS

The present invention provides an improved drop coating compound that meets the requirements for such drop coating compounds, but does not exhibit the disadvantages of typical drop coating compounds.

The drop coating compound of the present invention is based on a cationically curable epoxy resin. The curing process, for the drop coating compound is initiated by ultraviolet light through the assistance of a photo initiator. The present invention provides a compound that can be stored for a long period of time in the dark. The present invention also provides a compound that allows for simple and unproblematical manipulations.

An additional advantage of the compound of the present invention, is that a heating step is not required for curing the drop coating. The curing process is initiated by ultraviolet light, and automatically proceeds up to a complete through-hardening, i.e., to the end reaction of all reactive groups.

Although known two-component resins typically include the disadvantage and risk that the drop when applied will run, this concern is avoided by the present invention. Accordingly, the compounds of the present invention allow one to produce drops of a precisely defined geometry or drops having a specific height and area. This is due to the fact that the geometry of the drop is preserved during curing and the drop does not run. One of the disadvantages of a thermally curing system is that the drops tend to run when they are brought to a temperature that allows them to cure, too quickly.

The compound of the present invention includes a filler that is tightly packed within the resin matrix. This creates a compound wherein the volume is filled, to a large degree, and the drop coating compound thereby has a low coefficient of expansion. Pursuant to the present invention, coefficients of expansion of 20 ppm/K and below are achieved with the drop coating compounds given a temperature range of from approximately room temperature to about 90° C.

Given a high glass temperature of above 140° C., a low coefficient of expansion is maintained for the entire range of temperatures that are used. The drop coating compounds further exhibit the desirable properties of epoxy resins such as resistance to chemicals, high mechanical strength, and high obtainable purity. The purity of the resin is of great significance, particularly in view of the ability to limit the content of corrosion-promoting alkali and chloride ions.

The filler for the epoxy resin compounds of the present invention must meet certain requirements. First, as already stated, the filler must be compatible with the cationic curing process. To this end, the filler cannot interfere with the chemical reactions occurring during the curing process of the resin. Therefore, fillers that react in a highly basic fashion are not used.

Further, the filler should be transparent to the ultraviolet light used for curing in order to allow the photoinitiator to be sufficiently excited during irradiation even if the compound is used so that it creates a thick layer. Of course, the fillers should not contain any detrimental impurities and should have a low α-ray emission. In order to achieve a desired bond between the resin and the filler and the ability to reproduce the properties of the compound, the filler should have a defined surface and grain size distribution of the particles.

It has been found that aluminum oxide, aluminum hydroxide, calcium carbonate, magnesium oxide, silica, vitreous fused silica, and glass are especially suitable for the drop coating compounds of the present invention. By selecting certain fillers further desirable properties can be achieved for the resultant compound as required. For example, with aluminum hydroxide, a virtually non-flammable drop coating compound is achieved. Use of aluminum oxide as the filler results in a high thermal conductivity. Silica has a low coefficient of expansion and can be produced with high purity. Glass allows filler particles having an arbitrary shape to be most easily manufactured. For example, flakes, laminae, spherical particles, short fibers or even hollow balls are possible with glass. Vitreous fused silica has a low coefficient of thermal expansion of <1 ppm/K. In a preferred embodiment, fused silica is used as the filler.

As previously stated choosing the filler based on grain size distribution can result in advantageous properties. An especially tight packing of the compound is achieved, for example, when grain size distributions for the filler are used in the following ranges:

a) approximately 55 to about 95 weight percent of the particles have a diameter of approximately 1 to about 150 μm;

b) approximately 1 to about 35 weight percent of the particles have a diameter of approximately 1 to about 25 μm; and c) approximately 0.5 to about 20 weight percent of the particles have a diameter smaller than approximately 5 μm.

Besides selecting the grain size distribution, the quality of the surfaces of the filler particles can also be important in achieving an optimum, i.e., high degree, of volume filling of the drop coating compounds. To this end, it has been found that a better embedding of the particles into the resin matrix is achieved when the surfaces of the filler particles are chemically treated. Accordingly, an agent should be selected for treating the filler so that organic residues with reactive groups are bonded to the particle surfaces of the filler, the reactive groups being suitable for reaction with the epoxy resin. In the curing process, these reactive groups will react with the resin and create a good chemical bonding of the filler particles into the matrix. For use as reactive groups, all groups that react with epoxies, but do not adversely affect the cationic curing process, can be used.

By using such a surface treatment, the present invention allows one to also lower the viscosity of the drop coating compounds. This is due to the fact that the surface treatment allows smaller filler particles to penetrate better into the cavities between larger particles and to displace the resin therein and, so to speak, to release it. This creates a better flowing of the overall compound. The chemical bonding of the filler particles into the resin matrix also effects a better transfer of the low coefficient of thermal expansion of the filler onto the entire drop coating compound.

It should be noted, however, that the possible fillers in the compounds of the present invention are not limited to inorganic materials. Similar advantageous effects can be achieved utilizing high-performance plastics. Examples of such high-performance plastics include polyethersulfone (PES), polyphenylensulfide (PPS), polyetheretherketone (PEE), silicone resins, and liquid-crystalline polymers (LCP). Potentially surface-treated, these can be utilized as powder, fibers, and the like. Of course, mixtures of different inorganic and of inorganic and organic fillers are also possible in the present invention.

The epoxy resins that can be used in the present invention are likewise not unduly limited. Fundamental requirements for the epoxy resin are that their curing can be cationically initiated with an adequately quick hardening speed, they have a high glass temperature above 140° C., a low content of ions, particularly alkali and chloride ions and, have a high mechanical strength.

It is believed that nearly all commercially available resins and their mixtures are fundamentally suitable for this purpose. Examples of suitable resins include oligomeric or polymeric epoxy resins of the glycidylether type. The following can serve as a basis for the glycidal ethers: bisphenols, for example by bisphenol-A; dihydroxy or polyhydroxy aromatics, for example resorcin; polyaryl alkyls having phenolic OH groups; novolaks; polyalkylene glycols or multiple alcohols as well, for example glycerin or pentaerythritol. Also suitable are: epoxy urethane resins; compounds of the glycidylether-ester type, for example para-hydroxy benzoic acid-glycidylether-ester; pure glycidylesters of multiple carboxylic acid with an aliphatic or aromatic core, for example hexahydrophthalic acid or phthalic acid; and linear aliphatic epoxy resins, for example epoxied polybutadiene, epoxy soy bean oil or cycloaliphatic epoxy resins as well. The latter are distinguished by high reactivity; an example is 3,4-epoxycyclohexylmethyl-3,4-epoxycyclohexane carboxylate.

For the drop coating compounds of the present invention, mixtures of a number of these resins can advantageously be utilized. By using a mixture of resins, the desired chemical-physical and thermal-mechanical properties can more easily be set. For example, typically, a pure glycidal compound has too low a polymerization rate, whereas, for example, pure cycloaliphatic epoxy resins usually do not have adequate mechanical properties. Suitable epoxy resin mixtures can be achieved by utilizing a mixture of resins. For example, the resin mixture can include a basic polymer, for example, a novolac epoxy resin, a flexibilizing component, for example, an epoxied polybutadiene, and if desired, a further, low-molecular, multi-functional epoxy compound having, preferably, lower viscosity. Many low-molecular mono-epoxides, for example, are less suitable.

The epoxy resin mixture can include further constituents. For example, the mixture can include polymeric or oligomeric compounds that do not have any epoxy groups but do have groups that can react with epoxy groups. For example, a copolymer composed of butadiene and acrylonitrile, this being terminally functionalized with carboxyl or, preferably, with hydroxyl groups. Further constituents of the resin can include polyalcohols or, respectively, the vinyl ethers thereof, that can be copolymerized with epoxy resin. By way of example, the divinylethers of butane diol, tri-ethyleneglycol, or 1,4-cyclohexane-dimethanol be used for this purpose.

The drop coating compound also includes, as the last main constituent, a photo-initiator system. The photo-initiator system is electronically stimulated given irradiation with visible or, respectively, ultraviolet light; as a result a chemical modification of the photo-initiator system may occur.

During the catalytically initiated polymerization process of the epoxy resins, it is necessary that an acid is released. This can be a proton or, respectively, a protonized species, or can be a Lewis acid, for example, a metal ion wherein the polymerization reaction ultimately occurs. Once the polymerization process is triggered, it can proceed in the dark.

A great variety of different classes of chemical compounds are suitable as photo-initiators in the compounds of the present invention. For example, the salts of stable, organic cations represent one group of suitable compounds; particularly, those including sulfur or iodine as their central atom. Aromatic onium salts have been found to be especially suitable, for example, the diphenol-4-thiophenoxy-phenylsulfonium-hexafluoroantimonate or -hexafluorophosphate available from the Union Carbide Company or the bis-4-(diphenylsulfonio) phenylsulfide-bishexafluorophosphate or -bishexafluoroantimonate available from Degussa. A photo-initiator that contains a Lewis acid can be used as a pi donor transition metal complex. For example, the pi-cyclo-pentadienyle-pi-isopropylbenzol-iron (II)-hexafluorophosphate available from Ciba Geigy as Irgacure 261 can be used.

Phenacylsulfonium salts, hydroxyphenylsulfonium salts well as sulfoxonium salts can also be used. Preferred anions are the complex fluorides of boron, phosphorous, arsenic, and antimony and anions of heteropoly acids. The photo-initiator can also consist of an organo-silicon compound. Under ultraviolet irradiation, a silanol is released from the organo-silicon compound that in turn initiates polymerization in the presence of aluminum alcoholates.

In addition to the above constituents, the drop coating compounds of the present invention can contain additional additives that are utilized for epoxy resins. These additives can provide additional properties to the compounds. For example, the additives can improve the method for applying the drop coating compound, but typically will not substantially influence the properties of the cured drop coating compound. By way of example, a few of the additives and their advantages will now be set forth.

By adding pigment additives to the compound, the resultant color of the drop coating compound can be matched to that of the component for the purpose of preventing the unauthorized viewing of the covered component. Of course, the pigment must be chosen so that an adequate transmissivity for the ultraviolet light is retained so as to not impede the photo-initiated curing process.

Thixotroping agents can be used to facilitate the application of thick coating layers. By using the thixotroping agents, the viscosity of a shorn plastic compound will be low and the viscosity of the plastic compound that is not mechanically loaded will be boosted. The use of a thixotroping agent will prevent a running of the resin structures that have been applied. A better running of an applied drop coating compound on a substrate can be achieved with leveling agents.

Degasification agents can be added to the resin. Degasification agents cause a rapid release of the gas bubbles that are unavoidably included in the mixture upon mixing of the drop coating compound. If these bubbles were not released, they could have an undesirable influence on the properties of the drop coating compounds.

By utilizing flame-proofing agents, the flammability of thermally loaded components covered with the compound of the invention can be reduced.

Wetting agents, added to the compound, can reduce the repulsion forces between the foundation and the drop coating compound. Adhesion promoter additives will intensify the attractive interactions between the drop coating compound and the substrate. Instead of adding these two additives to the compound, they can also be applied on the surface to be coated.

When the drop coating compound is to be used for hybrid circuits that contain thick-film or, respectively, thin-film resistors, it is especially advantageous when the compound includes an absorber for radiation in the long-wave, visible range or, respectively, in the near infrared range. Scattered laser light that arises in laser balancing of thick-film or, respectively, thin-film resistors will thereby be absorbed and will therefore not disturb the function of the covered components.

By way of example, and not limitation, a method for applying and curing the drop coating compounds of the present invention will now be set forth.

FIG. 1 illustrates an assembly 10 to be coated. The assembly can be composed of, for example, a substrate 1 constructed from a ceramic. Electronic components (2 through 6) are applied thereon. These components can be, for example, ICs, capacitors, resistors or interconnects.

The drop coating compound is dripped onto the assembly 10 utilizing a dispenser 7. For example, the dispenser 7 can be a tubular nozzle that allows for a metered dispensing of a defined quantity 8 of the drop coating compound.

Referring now to FIG. 2, the assembly 10 is illustrated covered with two drops 9 of the drop coating compound. The steep edges of the drops 9 demonstrate that the coating compound can be applied as a relatively thick layer without a risk of the compound running. The drops 9 can therefore be designationally and exactly applied to a desired region of the assembly 10. Regions not to be covered, however, remain free both before, as well as, after the curing of the compound, since the compound does not run.

FIG. 3 illustrates a portion of the drop 9. The figure illustrates the spatial tight packing of the filler particles 92 (illustrated spherically). The filler particles 92 are enclosed in the matrix 91 of the epoxy resin mixture. The interspaces between the larger filler particles are largely filled with smaller filler particles. Pursuant to the present invention, a high degree of volume filling is capable of being thereby achieved. A high degree of filling is especially significant for a low coefficient of thermal expansion.

FIG. 4 illustrates an arrangement for curing the drop coating compound. An assembly 10 that has regions covered with drop coating compound is irradiated with a radiation source 21. Optionally, an optics composed, for example, of lenses 22 and 23 is used. The path of the beam is referenced as 24. For example, a radiation source 21 can be used that is a medium-pressure or high-pressure mercury lamp. Other radiation sources, however, can be used. The radiation sources need only be capable of generating an adequate light intensity.

The wavelength, of the radiation source, should be selected only as required by the photo-initiator and, can be arbitrarily varied together with the photo-initiator. A photo-initiator that absorbs and reacts optimally long-wave is desirable because a better depth of curing is achieved as a result thereof. Typically, due to their nature, most resins have an increased absorption in the short-wave range. A higher light intensity is therefore required as a result thereof for the complete curing of the drop coating compound down into the lowest layer regions. A monochromatic light source is also advantageous insofar as it can produce an adequate light intensity. Curing with lasers can yield technical advantages but is costly.

The curing time required for curing with the medium-pressure mercury lamp set forth about, is approximately 10 seconds to about 10 minutes dependent on the composition of the coating compounds. Typically, the curing time is usually between approximately 1 to about 5 minutes. In addition to the composition of the drop coating compound, the height of the coating is also a determinate factor with respect to the irradiation time required for complete curing of the coating drops. The coating can have a height of up to several millimeters high.

By way of example, and not limitation, three examples of the drop coating compounds of the present invention will now be given. Some of the important properties of these examples are set forth in Table 1 below. The recited constituents of the three examples are recited in mass parts (MT) and can be mixed together in known manners. The commercial designation and the manufacturer are respectively set forth in the parentheses. The vitreous fused silica used has been surface-treated, this being expressed by the reference to EST (epoxy silane treated).

EXAMPLE NO. 1

33.3 MT cycloaliphate diepoxide (CY 179, Ciba Geigy)

33.3 MT cresol-novalak epoxy resin (Quatrex 3310, Dow Chemical)

33.3 MT flexibilizing reactive diluent (UVR 6200, UCC)

33.3 MT arylsulfoniumhexafluoroantgimonate (UVI 6974, UCC)

105.1 MT vitreous fused silica (FW 61 EST, Quarzwerke Frechen)

33.8 MT vitreous fused silica (FW 600 EST, Quarzwerke Frechen)

3.8 MT vitreous fused silica (VP 810-10/1 EST, Quarzwerke Frechen)

0.5 MT gamma-glycidoxypropyltrimethoxy-silane (A 187, UCC)

EXAMPLE NO. 2

The composition as in the first example but with different quantities of the vitreous fused silica constituents.

186.7 MT vitreous fused silica (FW 61 EST, Quarzwerke Frenchen)

42.0 MT vitreous fused silica (FW 600 EST, Quarzwerke Frenchen)

4.7 MT vitreous fused silica (VP 810-10/1 EST, Quarzwerke Frenchen)

EXAMPLE NO. 3

25.0 MT cycloaliphate diepoxy (CY 179, Ciba Geigy)

25.0 MT cresol-novalak epoxy resin (Quatrex 3310, Dow Chemical)

25.0 MT flexibilizing reactive duent (UVR 6200, UCC)

25.0 MT epoxidised soy bean oil (Edenol D 82, Henkel)

The remaining contents such as photo-initiator, fillers and additives are contained therein in the same mass parts as in Example No. 1.

TABLE 1

| Properties of The Drop Coating Compounds | | | |
|---|---|---|---|
| Examples | 1 | 2 | 3 |
| filler content (by weight) | 65% | 70% | 65% |
| filler content (by volume) | 49% | 55% | 49% |
| viscosity (Pas) | 25 | 63 | 20 |
| volume shrinkage due to curing | 2.3% | 2.0% | 2.3% |
| density of the cured compounds (g/cm$^3$) | 1.69 | 1.75 | 1.69 |
| coefficient of thermal expansion 25 through 75° C. | 22 | 19 | 25 |
| 175 through 225° C. (ppm/K) | 108 | 95 | |

The Table sets forth some of the advantageous properties of the drop coating compound of the present invention. It is particularly the low shrinkage that occurs during the curing process and the low coefficient of thermal expansion that make the compounds of the present invention particularly suited as drop coatings. The risk of a terminal ripping within a covered circuit and, thus, of a malfunction is noticeably reduced with the compound of the present invention. Adhesion to the substrate is also improved thereof less peeling of the drop coating compound occurs.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A drop coating compound having a low coefficient of expansion for unhoused electrical and electronic components, comprising:

a cationically curable epoxy resin mixture, curable by ultraviolet light, having, when cured, a glass temperature above 140° C., and having a coefficient of thermal expansion of at most 25 ppm $K^{-1}$ in the range from 25 through 75° C.;

a fine particle filler compatible with a cationic curing process and transparent to ultraviolet light having a maximum grain size of 150μm and a grain size distribution allowing an optimally tight spatial packing, the filler being vitreous fused silica and comprising approximately 30 to about 80% by volume of the compound; and a photo-initiator for a cationic curing process.

2. The drop coating compound of claim 1 wherein the filler has the following grain size distribution:

approximately 55 to about 95 weight percent of the filler particles having a diameter between approximately 1 to about 25 μm; and approximately 0.5 to about 20 weight percent of the filler particles having a diameter below approximately 5 μm.

3. The drop coating compound of claim 1 wherein the surface of the filler particles is chemically pre-treated with an agent so as to have organic residues with reactive groups that are suitable for reaction with the epoxy resin.

4. The drop coating compound of claim 1 wherein the epoxy resin mixture additionally contains a flexibilizing constituent that is adapted to provide desired properties.

5. The drop coating compounds of claim 1 including additional additives.

6. The drop coating compound of claim 1 wherein multiple alcohols capable of reacting with the epoxy resin are contained therein.

7. The drop coating compounds of claim 1 wherein epoxy soy bean soil is contained therein.

8. The drop coating compounds of claim 1 wherein a further constituent is contained therein that absorbs light of the wavelength range that covers the emission used for the laser balancing of resistors.

9. The drop coating of claim 1 used to coat an unhoused IC, hybrid circuit, memory component and discrete component.

10. A drip covering a part of a surface of an electronic component composed of a drop cover compound comprising:

a cationically curable epoxy resin mixture;

a photoinitiator for a cationic curing process;

approximately 45 to about 80 volume percent of a fine-particle filler being vitreous fused silica having a maximum grain size of 150 μm and having a grain size distribution so that a suitable spatially tight packing is achieved; and the drip cover compound being curable through initiation with ultraviolet light without additional temperature elevation, having a glass temperature of more than 140° C., and having a coefficient of thermal expansion of at most 25 ppm $K^{-1}$ in the range from 25 through 75° C.

* * * * *